United States Patent
Park

(10) Patent No.: US 7,224,233 B2
(45) Date of Patent: May 29, 2007

(54) SMART LOCK-IN CIRCUIT FOR PHASE-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 13 days.

(21) Appl. No.: 11/036,837

(22) Filed: Jan. 15, 2005

(65) Prior Publication Data

US 2006/0158261 A1    Jul. 20, 2006

(51) Int. Cl.
*H03L 7/00* (2006.01)
(52) U.S. Cl. ............... 331/16; 331/17; 331/DIG. 2
(58) Field of Classification Search ........... 331/57, 331/DIG. 2, 17, 16
See application file for complete search history.

(56) References Cited

U.S. PATENT DOCUMENTS 6,229,403 B1 * 5/2001 Sekimoto ............ 331/57

2003/0214361 A1 * 11/2003 Nishikido ............ 331/57
2005/0088247 A1 * 4/2005 Yasui ............ 331/57

\* cited by examiner

*Primary Examiner*—Robert Pascal
*Assistant Examiner*—Levi Gannon

(57) ABSTRACT

The smart lock-in circuits basically include a sensor, two stacked PMOS transistors, two stacked NMOS transistors, and a feedback line. If the sensing voltage does not reach the expected voltage compared to the midpoint voltage of the sensor, the output voltage of the sensor turns on the corresponding transistor, which provides a current to its output until the voltage at feedback reaches the midpoint voltage. The time to reach the midpoint voltage at a filter is simply equal to the charge stored at the filter divided by the current, which can be scaled by a device aspect ratio of the transistor. Consequently, all smart lock-in circuits provide an initial loop condition closer to the expected loop condition according to schedule.

19 Claims, 7 Drawing Sheets

200

100

110

120

300

SMART LOCK-IN CIRCUIT FOR PHASE-LOCKED LOOPS

FIELD OF THE INVENTION

The present invention relates to the field of fast-locking phase-locked loops and more particularly to smart lock-in circuit for phase-locked loops.

BACKGROUND ART

Phase-looked loop is a vitally important device. Phase-looked loop is analog and mixed signal building block used extensively in communication, networks, digital systems, consumer electronics, computers, and any other fields that require frequency synthesizing, clock recovery, and synchronization.

Prior Art FIG. 1 illustrates a block diagram of a basic architecture of two types of conventional phase-locked loops, which are a conventional phase-locked loop 110 and a conventional fast-locking phase-locked loop 120. The conventional phase-locked loop 110 typically consists of a phase-frequency detector (or phase detector), a charge-pump, a low-pass filter, and a voltage-controlled oscillator in a loop. Phase-locked loops without any frequency divider in a loop are considered here for simplicity. The phase-frequency detector (or phase detector) is a block that has an output voltage with an average value proportional to the phase difference between the input signal and the output signal of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage drives the voltage-controlled oscillator. The negative feedback of the loop results in the output of the voltage-controlled oscillator being synchronized with the input signal. As a result, the phase-locked loop is in lock.

In the conventional phase-locked loop 110 of Prior Art FIG. 1, lock-in time is defined as the time that is required to attain lock from an initial loop condition. Assuming that the phase-locked loop bandwidth is fixed, the lock-in time is proportional to the difference between the input signal frequency and the initial voltage-controlled oscillator's frequency as follows:

$$\frac{(\omega_{in} - \omega_{osc})^2}{\omega_0^3}$$

where $\omega_{in}$ is the input signal frequency, $\omega_{asc}$ is the initial voltage-controlled oscillator's frequency, and $\omega_0$ is the loop bandwidth. The loop bandwidth must be wide enough to obtain a fast lock-in time. But most systems require a fast lock-in time without regard to the input signal frequency, bandwidth, and output phase jitter due to external noise. However, the conventional phase-locked loop 110 shown in Prior Art FIG. 1 has suffered from slow locking and harmonic locking. Thus, time and power are unnecessarily consumed until the phase-locked loops become locked. In addition, it has taken a vast amount of time to simulate and verify the conventional phase-locked loop 110 before fabrication since the simulation time of phase-locked loop circuits is absolutely proportional to time that is required the phase-locked loops to be locked. This long simulation adds additional cost and serious bottleneck to better design time to market. For these reasons, the conventional phase-locked locked loop 110 of Prior Art FIG. 1 is very inefficient to implement in an integrated circuit (IC) or system-on-chip (SOC).

To overcome the drawbacks of the conventional phase-locked loop 110 of Prior Art FIG. 1, a conventional fast-locking phase-locked loop 120 of Prior Art FIG. 1 is illustrated. The conventional fast-locking phase-locked loop 120 consists of a digital phase-frequency detector, a proportional-integral controller 122, a 10-bit digital-to-analog converter 124, and a voltage-controlled oscillator. Unfortunately, the conventional fast-locking phase-locked loop is costly, complicated, and inefficient to implement in system-on-chip (SOC) or integrated circuit (IC) because additional proportional-integral controller 122 and the 10-bit digital-to-analog converter 124 take much more chip area, consume much more power, and make the stability analysis very difficult. The complexity increases the number of blocks that need to be designed and verified. The conventional fast-locking phase-locked loop 120 might improve the lock-in time, but definitely results in bad time-to-market, higher cost, larger chip area, much more power consumption, and longer design time.

Thus, what is desperately needed is a highly cost-effective fast-locking phase-locked loop that can be highly efficiently implemented with a drastic improvement in a very fast lock-in time, lock-in time controllability, performance, cost, chip area, power consumption, stand-by time, and fast design time for much better time-to-market. At the same time, serious harmonic locking problem has to be resolved. The present invention satisfies these needs by providing smart lock-in circuits.

SUMMARY OF THE INVENTION

The present invention provides five types of the smart lock-in circuits for phase-locked loops. The smart lock-in circuits simultaneously enable any phase-locked loop to be locked according to schedule. The basic architecture of the smart lock-in circuits consists of a sensor, two stacked PMOS transistors, two stacked NMOS transistors, and a feedback line. The sensor senses a voltage at its input. If the sensing voltage does not reach the expected voltage compared to the midpoint voltage of the sensor, the output voltage of the sensor turns on the corresponding transistor, which provides a current to its output until the output voltage reaches the midpoint voltage. The time to reach the midpoint voltage at the filter is simply equal to the charge stored at the filter divided by the current, which can be scaled.

Consequently, all smart lock-in circuits provide a significant reduction in the difference between the initial loop condition and the locked condition in order to overcome serious drawbacks simultaneously. The lock-in time controllability enables all of the phase-locked loops on the chip to be locked according to schedule. In addition, the present invention has five different embodiments which achieve a drastic improvement in a very fast lock-in time, lock-in time controllability, performance, cost, chip area, power consumption, stand-by time, and design time.

BRIEF DESCRIPTION OF THE DRAWINGS

The accompanying drawings, which are incorporated in and form a part of this specification, illustrate five embodiments of the invention and, together with the description, serve to explain the principles of the invention.

Prior Art

DESCRIPTION OF THE PREFERRED EMBODIMENTS

In the following detailed description of the present invention, five types of the smart lock-in circuits, numerous specific details are set forth in order to provide a through understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
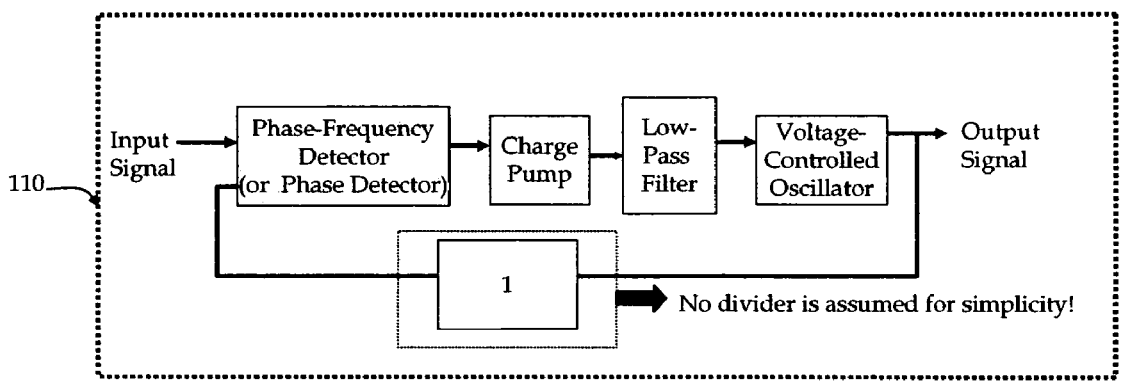
FIG. 1 illustrates a block diagram of two types of conventional phase-locked loops.
Figure 1:
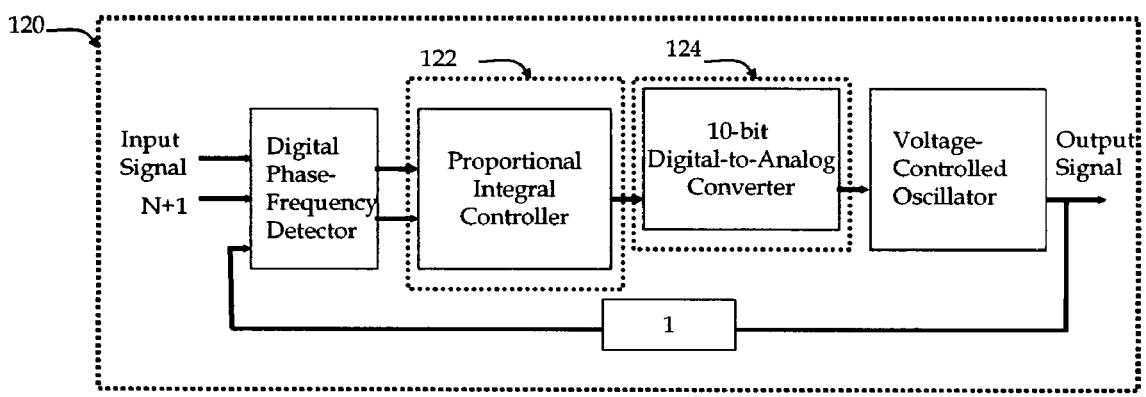
Figure 2:
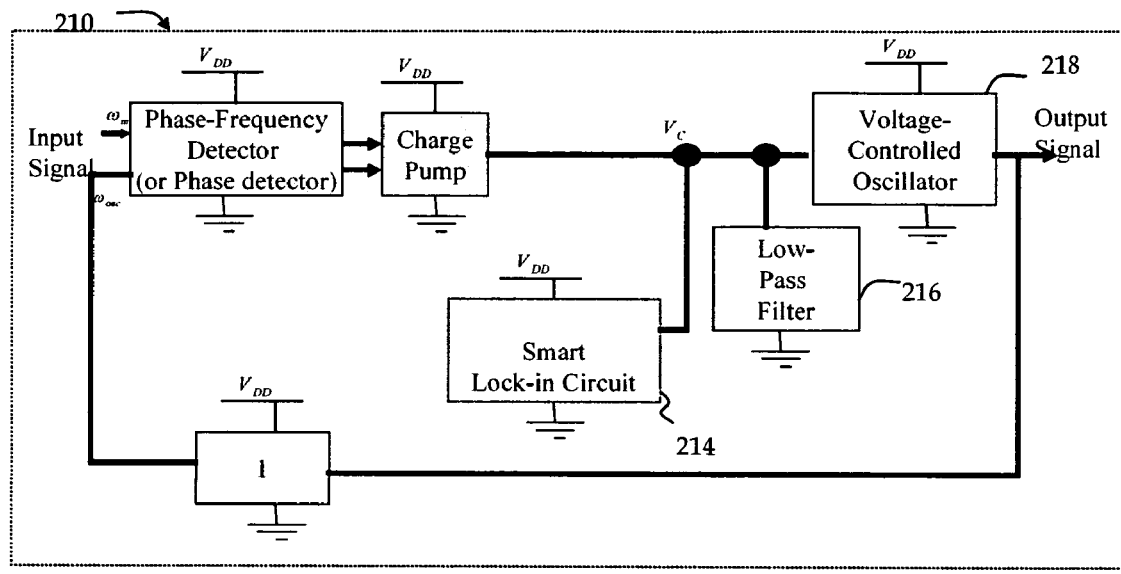
FIG. 2 illustrates a block diagram of two types of smart lock-in circuits for phase-locked loops in accordance with the present invention.
Figure 2:
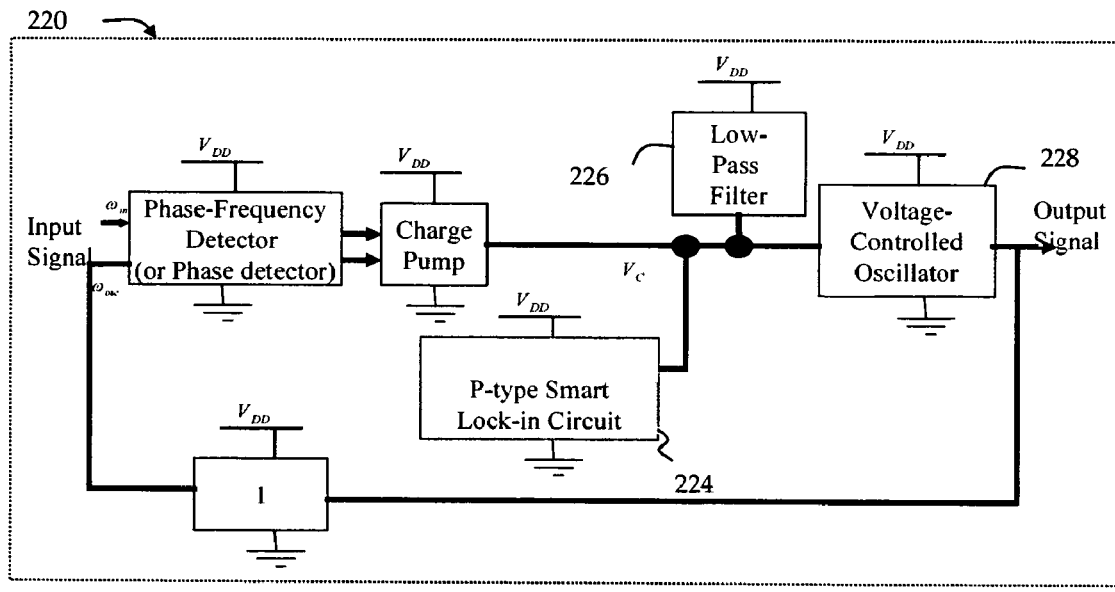

FIG. 2 illustrates a block diagram of two types of the smart lock-in circuits for phase-locked loops in accordance with the present invention. One type of the smart lock-in circuit is applied for phase-locked loops including a filter 216 connected between $V_C$ and ground, as seen in the phase-locked loop 210 shown in FIG. 2. The other type of the smart lock-in circuit called "p-type smart lock-in circuit" is applied for phase-locked loops including a filter 226 connected between $V_{DD}$ and $V_C$, as seen in the phase-locked loop 220 shown in FIG. 2. To reduce the difference between the initial loop condition and the locked condition, the outputs of the smart lock-in circuit 214 and the p-type smart lock-in circuit 224 are coupled to the outputs of the filter 216 and the filter 226, respectively, as shown in FIG. 2. The phase-locked loop 210 excluding the smart lock-in circuit 214 represents all types of phase-locked loops including a filter 216 connected between $V_C$ and ground without regard to the types of phase-locked loops because the applications of the smart lock-in circuit 214 is independent of architectures and types of phase-locked loops. The phase-locked loop 220 excluding the p-type smart lock-in circuit 224 represents all types of phase-locked loops including a filter 226 connected between $V_{DD}$ and $V_C$ without regard to the types of phase-locked loops because the applications of the p-type smart lock-in circuit 224 is independent of architectures and types of phase-locked loops. The filters 216 and 226 are low-pass filters. If these filters are multiple-order low-pass filters, then they will be approximated to the first-order filter with neglecting resistor in the filter for simplicity.

Figure 3:
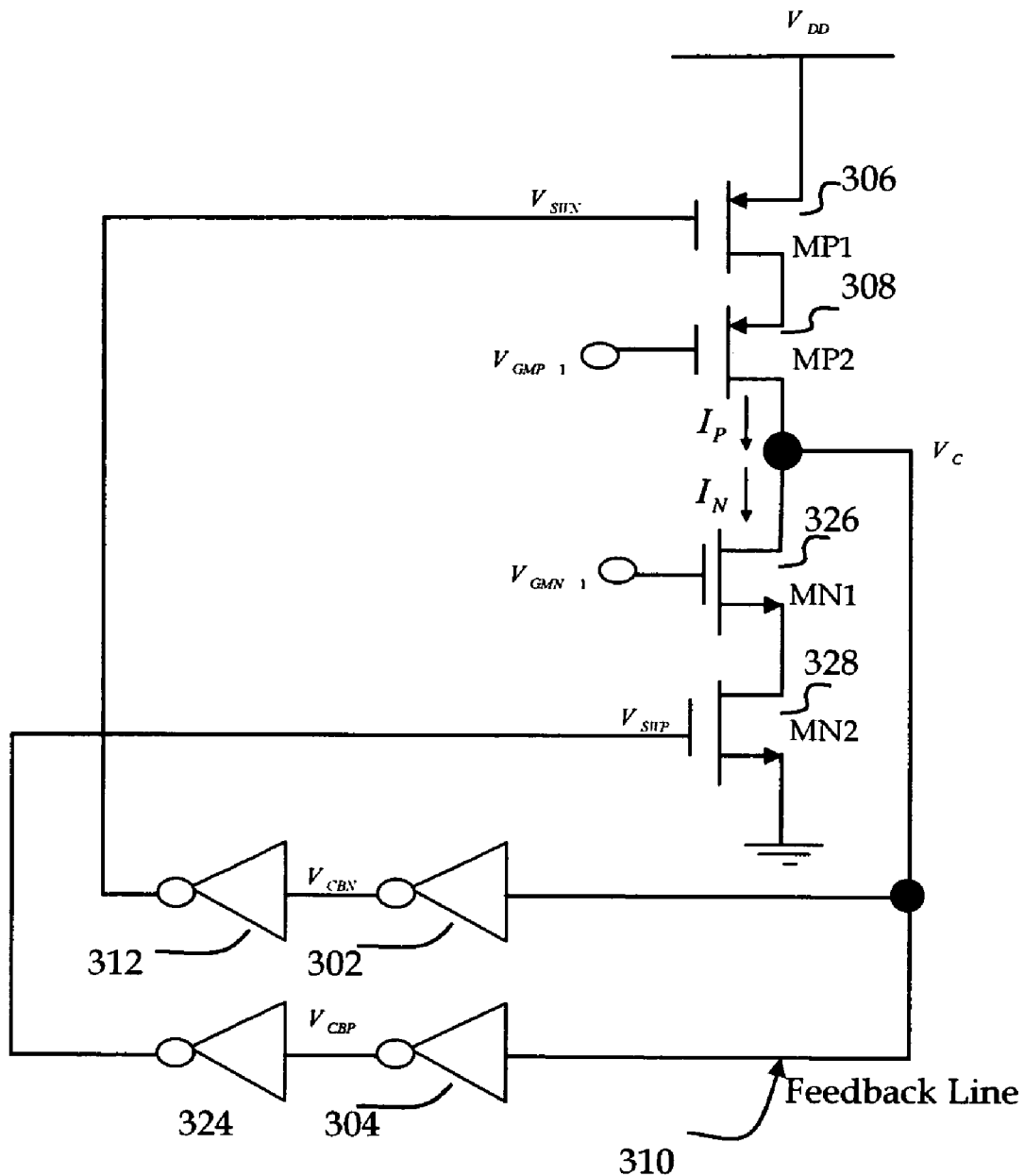
FIG. 3 illustrates a circuit diagram of a basic smart lock-in circuit according to the present invention.

FIG. 3 illustrates a basic smart lock-in circuit according to the present invention. This basic smart lock-in circuit 300 does not have power-down mode in order to show the fundamental concept of the invention clearly. The basic smart lock-in circuit 300 is a feedback circuit that consists of lower-voltage sensing inverters 302 and 312 (i.e., an even number of inverters), higher-voltage sensing inverters 304 and 324 (i.e., an even number of inverters), two stacked PMOS transistors 306 and 308, two stacked NMOS transistors 326 and 328, and a feedback line 310. The gate terminal of a PMOS transistor 308 is connected to a proper fixed-bias voltage (not shown) or ground (e.g., "0", low, etc.). The gate terminal of a NMOS transistor 326 is connected to a proper fixed-bias voltage (not shown) or power supply voltage (e.g., $V_{DD}$, "1", high, etc.).

It is assumed that the output of the basic smart lock-in circuit 300 is at ground. Since the first lower-voltage sensing inverter 302 initially senses a voltage less than the lower midpoint voltage of the first lower-voltage sensing inverter 302, the output voltage of the second lower-voltage sensing inverter 312 is low enough to turn on the PMOS transistor 306. At the same time, the output voltage of the second higher-voltage sensing inverter 324 is low enough to turn off the NMOS transistor 328. Thus, the PMOS transistor 306 provides a current (i.e., $I_P$) to the output until the output voltage (i.e., $V_C$) goes up to the lower midpoint voltage of the first lower-voltage sensing inverter 302. The time to reach the lower midpoint voltage at the filter connected between $V_C$ and ground is as follows:

$$\Delta t = \frac{V_M C_P}{I_P}$$

where $V_M$ is the lower midpoint voltage determined by the device aspect ratios of the first lower-voltage sensing inverter 302 and $C_P$ is the value of the capacitor in the filter. Thus, the lock-in time of the phase-locked loops including the filter connected between $V_C$ and ground is approximately given by $$\frac{(\omega_{in} - \omega_M)^2}{\omega_0^3} + \frac{V_M C_P}{I_P}$$

where $\omega_{in}$ is the input signal frequency, $\omega_M$ is the voltage-controlled oscillator's frequency for $V_C = V_M$, and $\omega_0$ is the loop bandwidth. This lock-in time is varied by the current $I_P$ depending on the size of the PMOS transistor 306.

It is assumed that the output of the basic smart lock-in circuit 300 is at power supply. Since the first higher-voltage sensing inverter 304 initially senses a voltage greater than the higher midpoint voltage of the first higher-voltage sensing inverter 304, the output voltage of the second higher-voltage sensing inverter 324 is high enough to turn on the NMOS transistor 328. At the same time, the output voltage of the second lower-voltage sensing inverter 312 is high enough to turn off the PMOS transistor 306. Thus, the NMOS transistor 328 provides a current (i.e., $I_N$) to the output until the output voltage (i.e., $V_C$) goes down to the higher midpoint voltage of the first higher-voltage sensing inverter 304. The time to reach the higher midpoint voltage at the filter connected between $V_C$ and power supply is as follows:

$$\Delta t = \frac{(V_{DD} - V_{M(H)}) C_P}{I_N}$$

where $V_{M(H)}$ is the higher midpoint voltage determined by the device aspect ratios of the first higher-voltage sensing inverter 304 and $C_P$ is the value of the capacitor in the filter. Thus, the lock-in time of the phase-locked loops including the filter connected between $V_C$ and power supply is approximately given by $$\frac{(\omega_{in} - \omega_{M(H)})^2}{\omega_0^3} + \frac{(V_{DD} - V_{M(H)})C_P}{I_N}$$

where $\omega_{in}$ is the input signal frequency, $\omega_{M(H)}$ is the voltage-controlled oscillator's frequency for $V_C = V_{M(H)}$, and $\omega_0$ is the loop bandwidth. This lock-in time is varied by the current $I_N$ depending on the size of the NMOS transistor 328.

The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD} - V_{T_n} - |V_{T_p}|}{1 + \sqrt{\frac{K_n}{K_p}}} + V_{T_n} \quad \text{where} \quad \frac{K_n}{K_p} = \frac{\mu_n C_{OX}\left(\frac{W}{L}\right)_n}{\mu_p C_{OX}\left(\frac{W}{L}\right)_p}$$

In design of the basic smart lock-in circuit of FIG. 3, it is also desirable to use a value for the lower midpoint voltage, $V_M$, less than $V_C'$ and a value for the higher midpoint voltage, $V_{M(H)}$, greater than $V_C'$. $V_C'$ is the voltage that makes the frequency of the voltage-controlled oscillator equal to the input signal's frequency.

Figure 4:
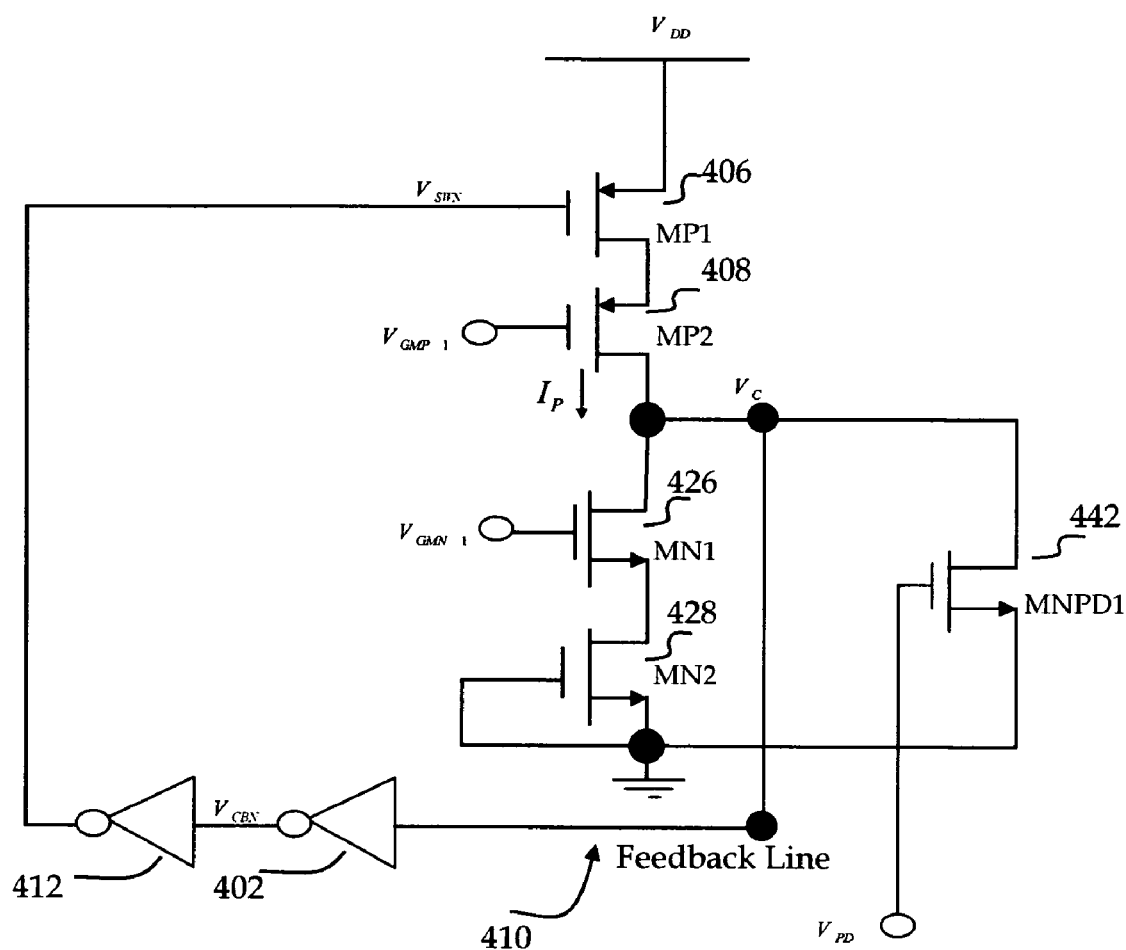
FIG. 4 illustrates a circuit diagram of a smart lock-in circuit in accordance with the present invention.

FIG. 4 illustrates a smart lock-in circuit 400 according to the present invention. A power-down input voltage, $V_{PD}$, is defined as the input voltage for power-down mode. The power-down enable system is in power-down mode when $V_{PD}$ is $V_{DD}$ and it is in normal mode when $V_{PD}$ is zero. The smart lock-in circuit 400 is a feedback circuit that consists of lower-voltage sensing inverters 402 and 412 (i.e., an even number of inverters), two stacked PMOS transistors 406 and 408, two stacked NMOS transistors 426 and 428, a feedback line 410, and a power-down NMOS transistor 442. In addition, the gate terminal of a PMOS transistor 408 is connected to a proper fixed-bias voltage (not shown) or ground (e.g., "0", low, etc.). The gate terminal of a NMOS transistor 426 is connected to a proper fixed-bias voltage (not shown) or power supply voltage (e.g., $V_{DD}$, "1", high, etc.). Furthermore, the gate terminal of a NMOS transistor 428 is shorted and thus no current flows into the drains of the NMOS transistors 426 and 428.

The circuit mode changes from power-down mode to normal mode in FIG. 4. Since the first lower-voltage sensing inverter 402 initially senses a voltage less than the lower midpoint voltage of the first lower-voltage sensing inverter 402, the output voltage of the second lower-voltage sensing inverter 412 is low enough to turn on the PMOS transistor 406. The PMOS transistor 406 generates a current (i.e., $I_P$) to the output until the output voltage (i.e., $V_C$) goes up to the lower midpoint voltage of the first lower-voltage sensing inverter 402. Furthermore, the lock-in time of the phase-locked loops including the filter connected between $V_C$ and ground is approximately given by $$\frac{(\omega_{in} - \omega_M)^2}{\omega_0^3} + \frac{V_M C_P}{I_P}$$

where $\omega_{in}$ is the input signal frequency, $\omega_M$ is the voltage-controlled oscillator's frequency for $V_C = V_M$, and $\omega_0$ is the loop bandwidth. Also, $V_M$ is the lower midpoint voltage determined by the device aspect ratios of the first lower-voltage sensing inverter 402 and $C_P$ is the value of the capacitor in the filter. The lock-in time is varied by the current $I_P$ depending on the size of the PMOS transistor 406.

In design of the smart lock-in circuit of FIG. 4, it is also desirable to use a value for the lower midpoint voltage, $V_M$, less than $V_C'$. $V_C'$ is the voltage that makes the frequency of the voltage-controlled oscillator equal to the input signal's frequency. The smart lock-in circuit 400 is used for all types of phase-locked loops including the filter connected between $V_C$ and ground.

Since the power-down NMOS transistor 442 is on during power-down mode, it provides an output pull-down path to ground. Thus, $V_C$ of the smart lock-in circuit 400 is zero so that no current flows into the circuits during power-down mode.

Figure 5:
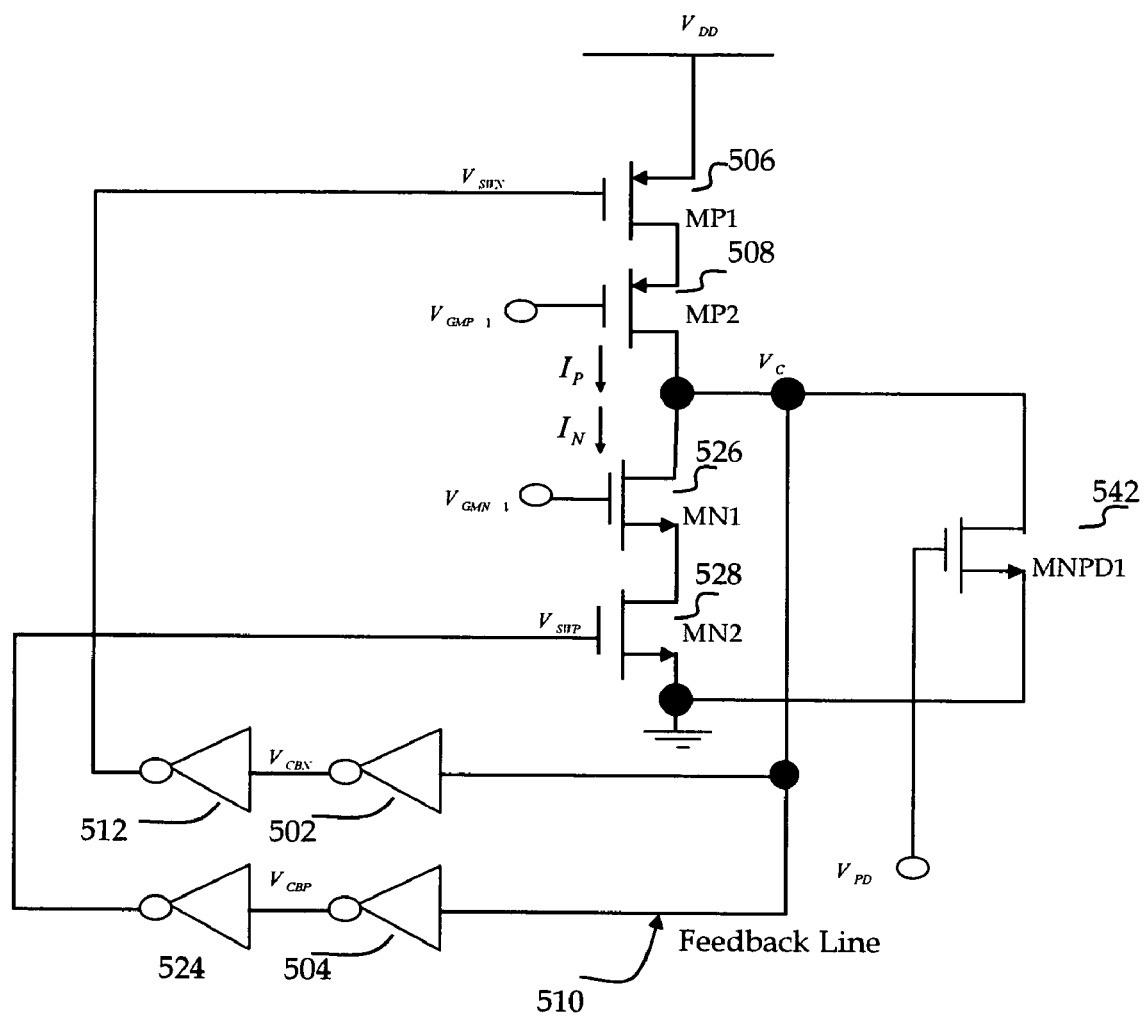
FIG. 5 illustrates a circuit diagram of a dual smart lock-in circuit according to the present invention.

FIG. 5 illustrates a dual smart lock-in circuit 500 in accordance with the present invention. The dual smart lock-in circuit 500 is a modification of the circuit described in FIG. 4. The gate terminal of a PMOS transistor 508 is connected to a proper fixed-bias voltage (not shown) or ground (e.g., "0", low, etc.). The gate terminal of a NMOS transistor 526 is connected to a proper fixed-bias voltage (not shown) or power supply voltage (e.g., $V_{DD}$, "1", high, etc.). Furthermore, compared to FIG. 4, the first difference to note is that the higher-voltage sensing inverters 504 and 524 (i.e., an even number of inverters) are added into FIG. 5 in order to provide the higher-voltage sensing function. The second difference to note is that the output of the second higher-voltage sensing inverter 524 is connected to the gate terminal of a NMOS transistor 528. Therefore, the dual smart lock-in circuit 500 is able to sense the lower-voltage as well as the higher-voltage while the smart lock-in circuit 400 is able to sense only the lower-voltage.

No current flows into the drains of the NMOS transistors 526 and 528 assuming $V_C < V_{M(H)}$ where $V_{M(H)}$ is the higher midpoint voltage decided by the device aspect ratios of the first higher-voltage sensing inverter 504. If $V_C$ is greater than $V_{M(H)}$, the gate voltage of the NMOS transistor 528 is $V_{DD}$. As a result, a current flows into the drains of the NMOS transistors 526 and 528 until $V_C$ goes down to $V_{M(H)}$.

In design of the dual smart lock-in circuit of FIG. 5, it is also desirable to use a value for the midpoint voltage, $V_M$, less than $V_C$ and a value for the higher midpoint voltage, $V_{M(H)}$, greater than $V'_C$. $V'_C$ is the voltage that makes the frequency of the voltage-controlled oscillator equal to the input signal's frequency. $V_M$ is the midpoint voltage decided by the device aspect ratios of the first lower-voltage sensing inverter 502. The dual smart lock-in circuit 500 is used for all types of phase-locked loops including the filter connected between $V_C$ and ground. Zero dc volt at $V_C$ ensures that no current flows into the circuits during power-down mode.

Figure 6:
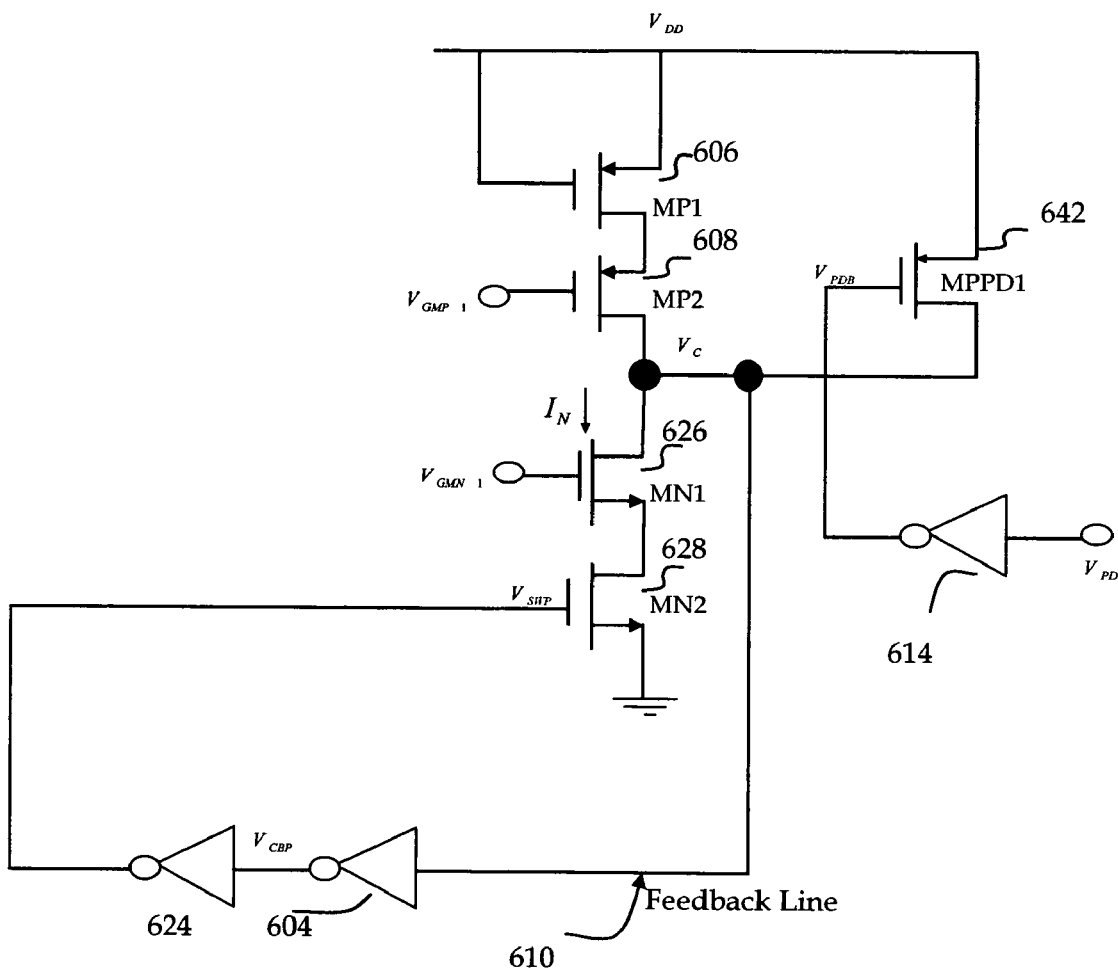
FIG. 6 illustrates a circuit diagram of a p-type smart lock-in circuit in accordance with the present invention.

FIG. 6 illustrates a p-type smart lock-in circuit 600 according to the present invention. The power-down input voltage, $V_{PD}$, is defined as the input voltage for the p-type power-down mode as well as for the power-down mode. The p-type power-down enable system is in power-down mode when $V_{PD}$ is $V_{DD}$ and it is in normal mode when $V_{PD}$ is zero. The p-type smart lock-in circuit 600 is a feedback circuit that consists of a higher-voltage sensing inverters 604 and 624 (i.e., an even number of inverters), two stacked PMOS transistors 606 and 608, two stacked NMOS transistors 626 and 628, a feedback line 610, a power-down inverter 614, and a power-down PMOS transistor 642. In addition, the gate terminal of a PMOS transistor 608 is connected to a proper fixed-bias voltage (not shown) or ground (e.g., "0", low, etc.). The gate terminal of a NMOS transistor 626 is connected to a proper fixed-bias voltage (not shown) or power supply voltage (e.g., $V_{DD}$, "1", high, etc.). Furthermore, since the PMOS transistor 606 is turned off, no current flows out of the drains of the PMOS transistors 606 and 608. Also, $V_{M(H)}$ is the higher midpoint voltage decided by the device aspect ratios of the first higher-voltage sensing inverter 604.

The circuit mode changes from p-type power-down mode to normal mode in FIG. 6. Since the first higher-voltage sensing inverter 604 initially senses a voltage greater than $V_{M(H)}$, the output voltage of the second higher-voltage sensing inverter 624 is high enough to turn on the NMOS transistor 628. The NMOS transistor 628 generates a current (i.e., $I_N$) to the output until the output voltage, $V_C$, goes down to $V_{M(H)}$. Thus, the lock-in time of the phase-locked loops including the filter connected between $V_C$ and power supply is approximately given by $$\frac{(\omega_{in} - \omega_{M(H)})^2}{\omega_0^3} + \frac{(V_{DD} - V_{M(H)})C_P}{I_N}$$

where $\omega_{in}$ is the input signal frequency, $\omega_{M(H)}$ is the voltage-controlled oscillator's frequency for $V_C = V_{M(H)}$, and $\omega_0$ is the loop bandwidth. Also, $C_P$ is the value of the capacitor in the filter and $V_{M(H)}$ is the higher midpoint voltage determined by the device aspect ratios of the first higher-voltage sensing inverter 604. The lock-in time is varied by the current $I_N$ depending on the size of the NMOS transistor 628.

In design of the p-type smart lock-in circuit of FIG. 6, it is also desirable to use a value for the higher midpoint voltage, $V_{M(H)}$, greater than $V_C'$. $V_C'$ is the voltage that makes the frequency of the voltage-controlled oscillator equal to the input signal's frequency. The p-type smart lock-in circuit 600 is used for all types of phase-locked loops including the filter connected between $V_C$ and power supply.

The output voltage of the power-down inverter 614, $V_{PDB}$, is zero during power-down mode. As a result, the power-down PMOS transistor 642 is turned on and thus provides an output pull-up path to $V_{DD}$. Therefore, $V_C$ of the p-type smart lock-in circuit 600 is $V_{DD}$ so that no current flows into the circuits during power-down mode. On the contrary, it was stated earlier that $V_C$ must be zero when power-down mode occurs in FIG. 4 and FIG. 5.

Figure 7:
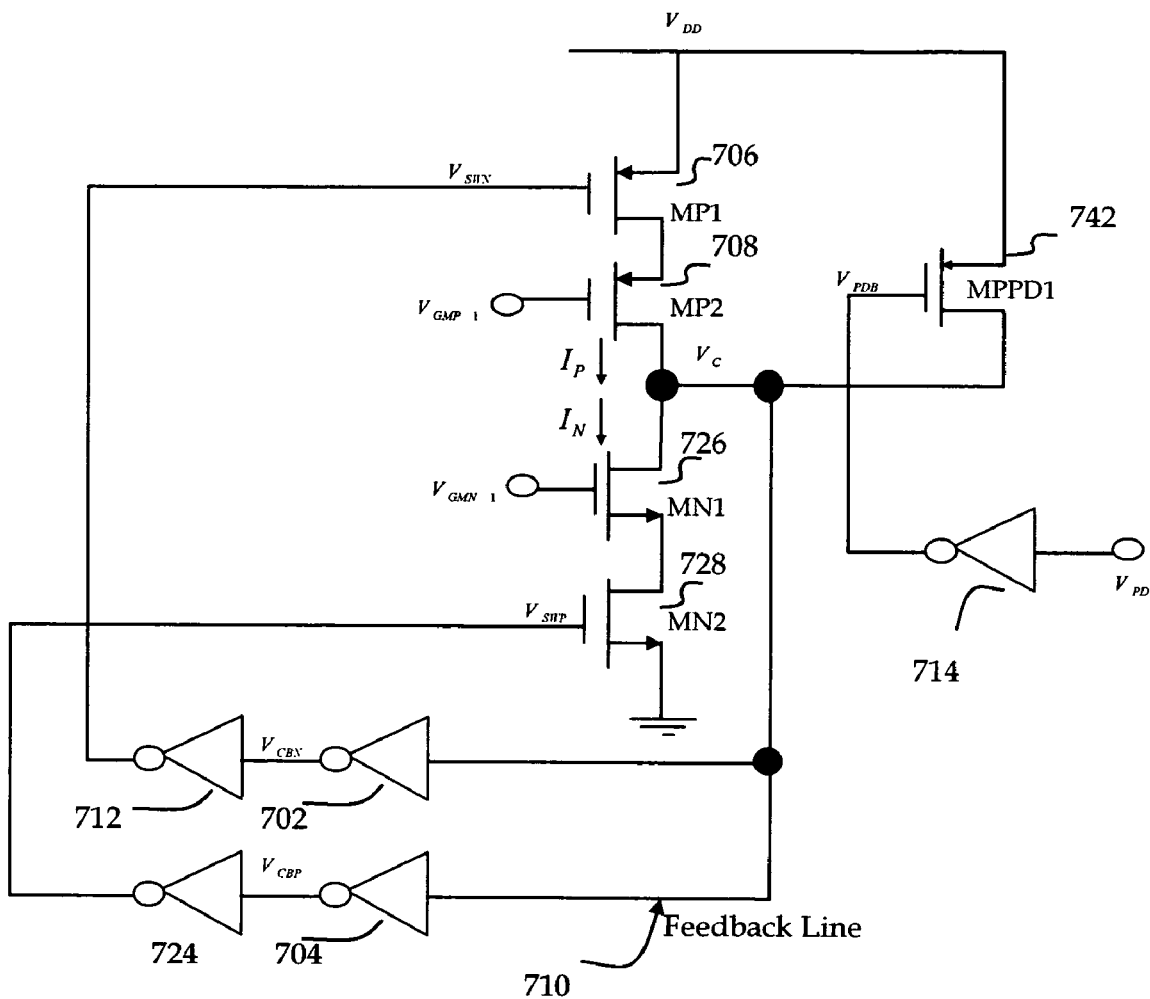
FIG. 7 illustrates a circuit diagram of a p-type dual smart lock-in circuit according to the present invention.

FIG. 7 illustrates a p-type dual smart lock-in circuit 700 in accordance with the present invention. The p-type dual smart lock-in circuit 700 is a modification of the circuit described in FIG. 6. The gate terminal of a PMOS transistor 708 is connected to a proper fixed-bias voltage (not shown) or ground (e.g., "0", low, etc.). The gate terminal of a NMOS transistor 726 is connected to a proper fixed-bias voltage (not shown) or power supply voltage (e.g., $V_{DD}$, "1", high, etc.). Compared to FIG. 6, the first difference to note here is that the lower-voltage sensing inverters 702 and 712 (i.e., an even number of inverters) are added into FIG. 7 in order to sense the lower-voltage. The second difference to note here is that the output of the second lower-voltage sensing inverter 712 is connected to the gate terminal of the PMOS transistor 706. The p-type dual smart lock-in circuit 700 is able to sense the lower-voltage as well as the higher voltage while the p-type smart lock-in circuit 600 is able to sense only the higher voltage.

No current flows out of the drains of the PMOS transistors 706 and 708 if $V_C$ is greater than $V_M$. $V_M$ is the lower midpoint voltage decided by the device aspect ratios of the first lower-voltage sensing inverter 702. If $V_C$ is less than $V_M$, the PMOS transistor 706 is turned on until $V_C$ goes up to $V_M$.

In design of the p-type dual smart lock-in circuit of FIG. 7, it is also desirable to use a value for the higher midpoint voltage, $V_{M(H)}$, greater than $V'_C$ and a value for the lower midpoint voltage, $V_M$, less than $V'_C$. $V'_C$ is the voltage that makes the frequency of the voltage-controlled oscillator equal to the input signal's frequency. The p-type dual smart lock-in circuit 700 is used for all types of phase-locked loops including the filter connected between $V_C$ and power supply. $V_C = V_{DD}$ in the p-type dual smart lock-in circuit 700 ensures that no current flows into the circuits during power-down mode.

In summary, the five smart lock-in circuits of the present invention simply control how fast the phase-locked loops become locked from an initial condition. Also, they provide a solution for harmonic locking problem. Furthermore, three smart lock-in circuits 300, 500, and 700 are highly effective for LC oscillator which has a very narrow tuning range. The balance between PMOS output resistance and NMOS output resistance is important to obtain high output resistance. Furthermore, the CMOS process variations usually must be considered so that the proper value of the midpoint voltage is chosen for all the smart lock-in circuits 300, 400, 500, 600, and 700. Each bulk of two stacked PMOS transistors can be connected to its own N-well to obtain better immunity from substrate noise in all smart lock-in circuits 300, 400, 500, 600, and 700.

The smart lock-in circuit 214 shown in FIG. 2 represents the basic smart lock-in circuit 300, the smart lock-in circuit 400, and the dual smart lock-in circuit 500, as shown in FIG. 3, FIG. 4, and FIG. 5, respectively. Also, the p-type smart lock-in circuit 224 shown in FIG. 2 represents the basic smart lock-in circuit 300, the p-type smart lock-in circuit 600 and the p-type dual smart lock-in circuit 700, as shown in FIG. 3, FIG. 6, and FIG. 7, respectively. It is noted that SPICE is used for the simulation of phase-locked loops. The conventional phase-locked loop 110 and the phase-locked loop 210 including the basic smart lock-in circuit 300 of the invention are simulated using the same components. As a result, the total simulation time of the conventional phase-locked loop 110 is 20 hours and that of the phase-locked loop 210 is 1.9 hours. This improvement can be accomplished by simply inserting a proper one of the five smart lock-in circuits into any conventional phase-locked loop, and the simulation time can be reduced by a factor of 10. So far, it should be noted that the same time step has been used for the SPICE simulation in order to accurately measure and compare the simulation time of all circuits.

All the smart lock-in circuits of the present invention are very efficient to implement in system-on-chip (SOC) or integrated circuit (IC). The present invention provides five different embodiments which achieve a drastic improvement in a very fast lock-in time, lock-in time controllability, performance, time-to-market, power consumption, stand-by time, cost, chip area, and design time. While the present invention has been described in particular embodiments, it should be appreciated that the present invention should not be construed as being limited by such embodiments, but rather construed according to the claims below.

What is claimed is:

1. A smart lock-in circuit for enabling any phase-locked loop including at least a filter to become locked according to schedule, comprising:
    a feedback line connected to an output and input of the smart lock-in circuit and also coupled to an output of a filter;
    a sensor for sensing a voltage at the filter output, comparing with a midpoint voltage decided by device aspect ratios of the sensor, and providing its response;
    two stacked PMOS transistors connected between power supply and the output; and
    two stacked NMOS transistors connected between the output and ground.

2. The circuit as recited in claim 1 wherein the sensor is a lower-voltage sensor whose device aspect ratios determine a lower midpoint voltage.

3. The circuit as recited in claim 2 wherein the lower-voltage sensor's output is coupled to the gate terminal of an upper PMOS transistor generating a current having a lock-in time parameter until a filter output voltage reaches the lower midpoint voltage of the lower-voltage sensor.

4. The circuit as recited in claim 1 wherein the sensor is a higher-voltage sensor whose device aspect ratios determine a higher midpoint voltage.

5. The circuit as recited in claim 4 wherein the higher-voltage sensor's output is coupled to the gate terminal of a lower NMOS transistor generating a current having a lock-in time parameter until a filter output voltage reaches the higher midpoint voltage of the higher-voltage sensor.

6. The circuit as recited in claim 1 wherein the sensor is both a lower-voltage sensor and a higher-voltage sensor.

7. The circuit as recited in claim 6 wherein the lower-voltage senso's output is coupled to the gate terminal of the upper PMOS transistor and the higher-voltage sensor's output is coupled to the gate terminal of the lower NMOS transistor.

8. The circuit as recited in claim 1 wherein the sensor is an even number of inverters.

9. The circuit as recited in claim 1 wherein the sensor functions as comparator.

10. The circuit as recited in claim 1 wherein the sensor is an even number of NAND gates since the two-input CMOS NAND gate can be used as an enabling inverter with one input serving as an active high enable input and the other used as the logical input.

11. The circuit as recited in claim 1 wherein the sensor is an even number of NOR gates since the two-input CMOS NOR gate can be used as an enabling inverter with one input serving as an active low enable input and the other used as the logical input.

12. The circuit as recited in claim 1 further comprising a power-down NMOS transistor so that no current flows into the circuit during power-down mode.

13. The circuit as recited in claim 12 wherein the output of the smart lock-in circuit is coupled to the output of the filter connected between the output and ground.

14. The circuit as recited in claim 12 wherein the output of the smart lock-in circuit is at ground when the power-down NMOS transistor input is at the power supply.

15. The circuit as recited in claim 1 further comprising a power-down PMOS transistor and a power-down inverter so that no current flows into the circuit during power-down mode.

16. The circuit as recited in claim 15 wherein the output of the smart lock-in circuit is coupled to the output of the filter connected between the output and power supply.

17. The circuit as recited in claim 15 wherein the output of the smart lock-in circuit is at power supply when the power-down PMOS transistor input is at ground.

18. The circuit as recited in claim 15 wherein a power-down inverter is an odd number of inverters.

19. The circuit as recited in claim 1 wherein the smart lock-in circuit is applied to all phase-locked loops including at least a filter without regard to architectures, topologies, and schematics.

* * * * *